United States Patent
Jin et al.

(10) Patent No.: US 12,207,519 B2
(45) Date of Patent: Jan. 21, 2025

(54) DISPLAY PANEL HAVING LIGHT CONTROL LAYERS AND METHOD FOR MANUFACTURING THE SAME

(71) Applicant: Samsung Display Co., LTD., Yongin-si (KR)

(72) Inventors: Youyoung Jin, Suwon-si (KR); Jae Cheol Park, Hwaseong-si (KR); Keunchan Oh, Hwaseong-si (KR); Gak Seok Lee, Hwaseong-si (KR); Sanghun Lee, Hwaseong-si (KR); Chang-Soon Jang, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 367 days.

(21) Appl. No.: 17/179,892

(22) Filed: Feb. 19, 2021

(65) Prior Publication Data
US 2021/0376000 A1 Dec. 2, 2021

(30) Foreign Application Priority Data

May 26, 2020 (KR) .......................... 10-2020-0063195

(51) Int. Cl.
*H10K 59/38* (2023.01)
*H10K 50/844* (2023.01)
*H10K 50/858* (2023.01)
*H10K 71/00* (2023.01)

(52) U.S. Cl.
CPC ........... *H10K 59/38* (2023.02); *H10K 50/844* (2023.02); *H10K 50/858* (2023.02); *H10K 71/00* (2023.02)

(58) Field of Classification Search
CPC .... H10K 59/38; H10K 50/844; H10K 50/858; H10K 71/00; H10K 50/854; H10K 59/122; H10K 59/124; H10K 59/126; H10K 59/1201; G02B 5/201
See application file for complete search history.

(56) References Cited

U.S. PATENT DOCUMENTS 9,140,944 B2   9/2015  Cho et al.
9,217,899 B2  12/2015  Kim et al.
9,442,328 B2   9/2016  Kim et al.
(Continued)

FOREIGN PATENT DOCUMENTS

JP       2017-73260      4/2017
KR   10-2014-0048731     4/2014
(Continued)

OTHER PUBLICATIONS

Extended European search report for European Patent Application or Patent No. 21175438.7 dated Nov. 3, 2021.

*Primary Examiner* — Jami Valentine Miller
*Assistant Examiner* — Zhijun Xu
(74) *Attorney, Agent, or Firm* — KILE PARK REED & HOUTTEMAN PLLC

(57) ABSTRACT

A display panel comprises a first substrate including a pixel area defined, and a second substrate disposed under the first substrate and including a light emitting element that emits first light to the first substrate. The first substrate includes a base layer, a color filter layer disposed under the base layer and disposed in the pixel area, a light control layer disposed under the color filter layer, and a first opening between the color filter layer and the light control layer.

15 Claims, 14 Drawing Sheets

(56) References Cited

U.S. PATENT DOCUMENTS

| | | | |
|---|---|---|---|
| 2007/0200492 A1* | 8/2007 | Cok | H10K 59/38 |
| | | | 313/506 |
| 2011/0273864 A1* | 11/2011 | Izawa | G02B 5/201 |
| | | | 252/301.4 R |
| 2014/0312339 A1* | 10/2014 | Fujita | H10K 59/38 |
| | | | 257/40 |
| 2019/0148458 A1* | 5/2019 | Kim | H10K 50/115 |
| | | | 257/89 |
| 2019/0296088 A1 | 9/2019 | Kim et al. | |

FOREIGN PATENT DOCUMENTS

| | | |
|---|---|---|
| KR | 10-2014-0057015 | 5/2014 |
| KR | 10-2015-0000215 | 1/2015 |
| KR | 10-2019-0110660 | 10/2019 |

* cited by examiner

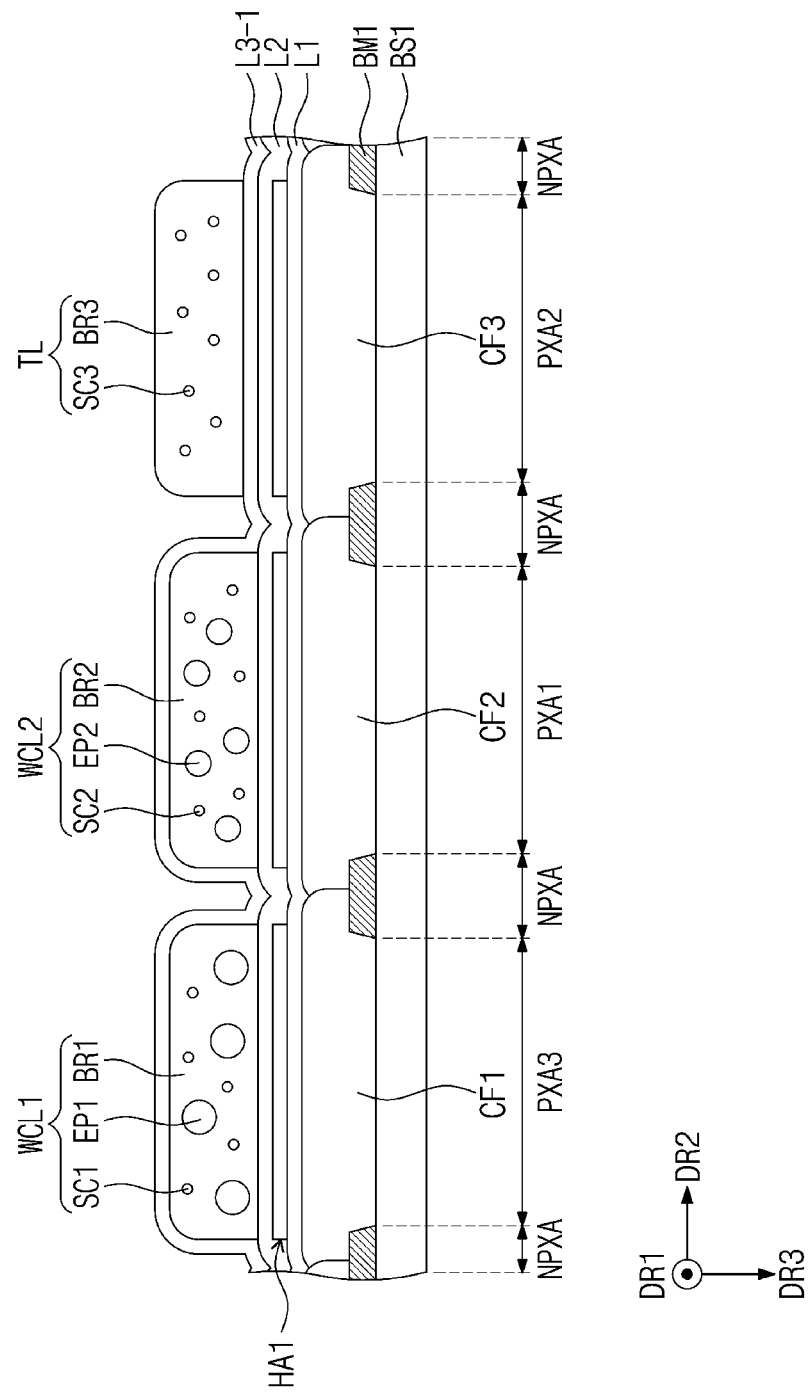

DISPLAY PANEL HAVING LIGHT CONTROL LAYERS AND METHOD FOR MANUFACTURING THE SAME

CROSS-REFERENCE TO RELATED APPLICATIONS

This U.S. non-provisional patent application claims priority to and the benefit of Korean Patent Application No. 10-2020-0063195 under 35 U.S.C. § 119, filed in the Korean Intellectual Property Office (KIPO) on May 26, 2020, the entire contents of which are incorporated herein by reference.

BACKGROUND

The disclosure relates to a display panel having improved light output efficiency and a method for manufacturing the display panel.

Display panels may include a light control layer to implement colors. The light control layer may include pigment particles having a predetermined color or luminous bodies emitting a predetermined color. In case that light provided to a pixel area is provided to an adjacent light control layer, the light output efficiency of display panels may be affected because of failure to control part of the light.

SUMMARY

The disclosure provides a display panel having improved light output efficiency and a method for manufacturing the display panel.

An embodiment provides a display panel including a first substrate including a pixel area, and a second substrate disposed under the first substrate and including a light emitting element that emits first light to the first substrate. The first substrate may include a base layer, a color filter layer disposed under the base layer and disposed in the pixel area, a light control layer disposed under the color filter layer, and a first opening between the color filter layer and the light control layer.

The color filter layer and the light control layer may be spaced apart from each other, and the first opening is between the color filter layer and the light control layer.

In a plan view, the color filter layer may overlap the light control layer and the first opening.

Air may be disposed in the first opening.

A refractive index inside the first opening may be about 1 to about 1.1.

a refractive index inside the first opening may be lower than a refractive index of the light control layer and a refractive index of the color filter layer.

The display panel may further include a first protective layer disposed between the color filter layer and the light control layer, and a second protective layer disposed between the first protective layer and the light control layer. The first opening may be between a portion of the first protective layer and a portion of the second protective layer, and the portion of the first protective layer and the portion of the second protective layer may be spaced apart from each other.

The first opening may be in the pixel area in a plan view.

The first substrate may comprise at least one second opening connected to the first opening in an area adjacent to the pixel area in the first substrate in a plan view.

The first substrate may comprise a third opening connected to the first opening in an area adjacent to the pixel area in the first substrate in the plan view, the third opening may be spaced apart from the at least one second opening, and the first opening may be between the third opening and the at least one second opening in the plan view.

The at least one second opening and the third opening may not overlap the light control layer.

The first substrate may comprise a plurality of second openings, the plurality of second openings may be spaced apart from each other, and the pixel area is disposed between the plurality of second openings.

The light emitting element may overlap the first opening, the color filter layer, and the light control layer.

The first light passing through the light control layer may be defined as second light, and a part of the second light may be totally reflected by a surface adjacent to the first opening.

In an embodiment, a method for manufacturing a display panel may include forming a first substrate including a pixel area, and bonding the first substrate and a second substrate to each other. The second substrate may comprise a light emitting element corresponding to the pixel area of the first substrate. The forming of the first substrate may include forming a color filter layer on a base layer, forming a photoresist layer on the color filter layer, forming an encapsulation layer on the photoresist layer, forming a light control layer on the encapsulation layer, removing a portion of the encapsulation layer, and removing the photoresist layer to form a first opening.

The removing of a portion of the encapsulation layer may include forming a second opening in an area adjacent to the pixel area of the first substrate.

The forming of the first opening may include removing the photoresist layer through the second opening.

The forming of the first substrate may include forming a plurality of barrier ribs on the encapsulation layer, and the forming of the light control layer may comprise disposing the light control layer between the plurality of barrier ribs.

The forming of the plurality of barrier ribs may be provided after the forming of the photoresist layer and before the forming of the light control layer.

The forming of the plurality of barrier ribs may be provided after the forming of the first opening.

BRIEF DESCRIPTION OF THE DRAWINGS

An additional appreciation according to the embodiments of the disclosure will become more apparent by describing in detail the embodiments thereof with reference to the accompanying drawings, wherein:

FIGS. 6A to 6D are schematic cross-sectional views illustrating a part of a method for manufacturing a display panel according to an embodiment.

DETAILED DESCRIPTION OF THE EMBODIMENTS

Figure 1:
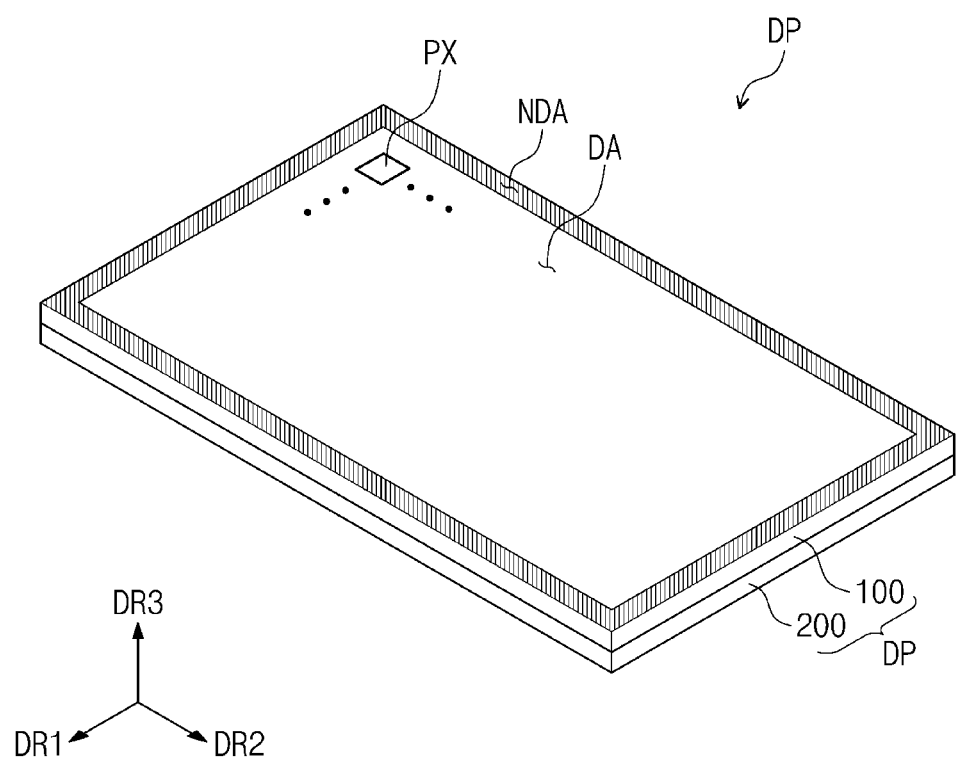
FIG. 1 is a schematic perspective view of a display panel according to an embodiment.

In the description, when an element (or a region, a layer, a portion, etc.) is referred to as being "on," "connected to," or "coupled to" another element, it means that the element may be directly disposed on/connected to/coupled to the other element, or that a third element may be disposed therebetween.

Like reference numerals refer to like elements. Also, in the drawings, the thickness, the ratio, and the dimensions of elements may be exaggerated for an effective description of technical contents.

The term "and/or," includes all combinations of one or more of which associated configurations may define. For example, "A and/or B" may be understood to mean "A, B, or A and B." In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms "first," "second," and the like may be used herein to describe various elements, these elements should not be limited by these terms. These terms are only used to distinguish one element from another. For example, a first element could be termed a second element, and, similarly, a second element could be termed a first element, without departing from the scope of example embodiments. The terms of a singular form may include plural forms unless the context clearly indicates otherwise.

The terms such as "below," "lower," "above," "upper," and the like are used to describe the relationship of the configurations shown in the drawings. The terms are used as a relative concept and are described with reference to the direction indicated in the drawings.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

It should be understood that the terms "comprise," "include," or "have" are intended to specify the presence of stated features, integers, steps, operations, elements, components, or combinations thereof in the disclosure, but do not preclude the presence or addition of one or more other features, integers, steps, operations, elements, components, or combinations thereof.

Hereinafter, some embodiments will be described with reference to the accompanying drawings.

FIG. 1 is a schematic perspective view of a display panel according to an embodiment.

Referring to FIG. 1, a display area DA and a non-display area NDA may be defined in the display panel DP. The non-display area NDA may be adjacent to the display area DA.

The display area DA may be an area for displaying an image. The non-display area NDA may be an area in which an image is not displayed. Pixels PX may be disposed in the display area DA. The pixels PX may not be disposed in the non-display area NDA. The pixels PX may refer to effective pixels providing an image.

The display area DA may be parallel to a plane defined by a first direction DR1 and a second direction DR2. The normal direction of the display area DA, which is the thickness direction of the display panel DP, is indicated as a third direction DR3. A front surface (or an upper surface) and a rear surface (or a lower surface) of each member may be defined in the third direction DR3. The term "on a plane" or "in a plan view" may be defined as viewing the object from above in the third direction DR3.

The display panel DP may not only be used for large-sized electronic devices such as a television set, a monitor, or an outdoor billboard but also used for small- and medium-sized electronic devices such as a personal computer, a laptop computer, a personal digital terminal, a car navigation unit, a game console, a portable electronic device, and a camera. These are merely presented as an example, and thus it may be adopted for other electronic devices without departing from the disclosure.

A bezel area of the display panel DP may be defined by the non-display area NDA. The non-display area NDA may be an area adjacent to the display area DA. The non-display area NDA may surround the display area DA. However, the embodiments are not limited thereto, and the shape of the display area DA and the shape of the non-display area NDA may be relatively designed. In an embodiment, the non-display area NDA may be omitted.

The display panel DP may include a first substrate 100 and a second substrate 200. The first substrate 100 may include a pixel area and a light blocking area, and the second substrate 200 may include light emitting elements. This will be described below.

Figure 2:
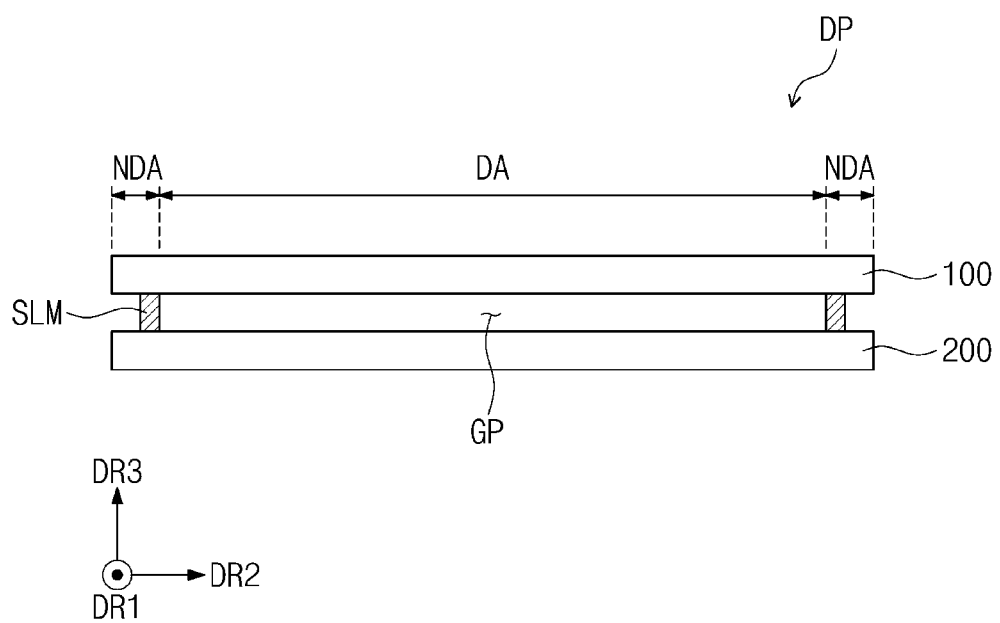
FIG. 2 is a schematic cross-sectional view of a display panel according to an embodiment.

FIG. 2 is a schematic cross-sectional view of a display panel according to an embodiment.

Referring to FIG. 2, the display panel DP may include a first substrate 100 and a second substrate 200. The first substrate 100 and the second substrate 200 may face each other and be spaced apart from each other. Accordingly, a predetermined cell gap GP may be provided between the first substrate 100 and the second substrate 200.

A filling layer may be disposed in the cell gap GP. The filling layer will be described below.

The cell gap GP may be maintained by a sealant SLM bonding the first substrate 100 and the second substrate 200. The sealant SLM may include an organic adhesive member or an inorganic adhesive member. The sealant SLM may include frits.

Figure 3:
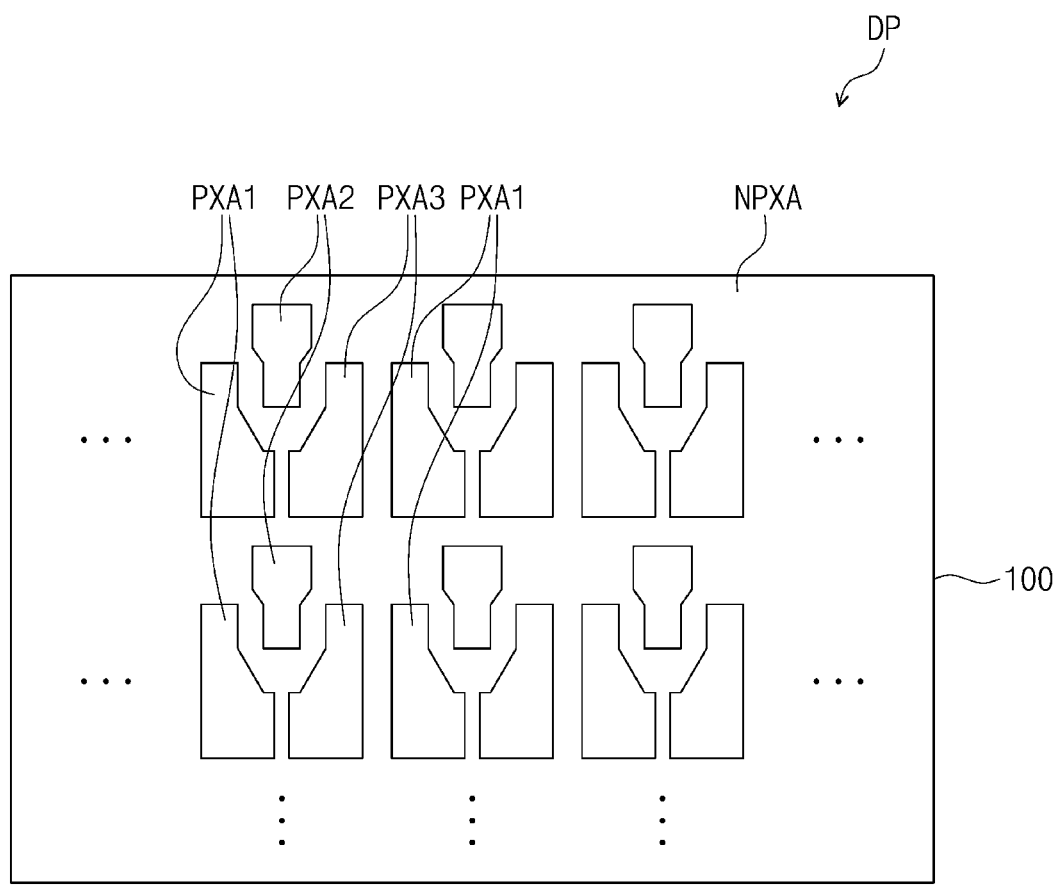
FIG. 3 is a schematic plan view of a display panel according to an embodiment.
Figure 3:
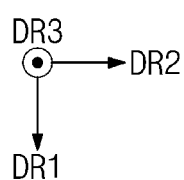

FIG. 3 is a schematic plan view of a display panel according to an embodiment.

Referring to FIG. 3, first pixel areas PXA1, second pixel areas PXA2, third pixel areas PXA3, and a light blocking area NPXA are defined in the first substrate 100 of the display panel DP. The display panel DP provides first color light through the first pixel areas PXA1, the second pixel areas PXA2 provide second color light, and the third pixel areas PXA3 provide third color light. The first color light, the second color light, and the third color light each may have different colors from one another. For example, the first color light may be green light, the second color light may be blue light, and the third color light may be red light.

The first pixel areas PXA1 may be arranged in the first direction DR1 and the second direction DR2. The shapes of the third pixel areas PXA3 and the shapes of first pixel areas PXA1 may be symmetrical about an axis extending in the first direction DR1. Each of the second pixel areas PXA2 may be disposed between corresponding one of the first pixel areas PXA1 and corresponding one of the third pixel areas PXA3. When viewed in the second direction DR2, a portion of the second pixel areas PXA2 may not overlap the first pixel areas PXA1 and the third pixel areas PXA3. However, this is presented as an example, and the shape and arrangement relationship of the pixel areas according to an embodiment are not limited thereto. For example, the first pixel areas PXA1, the second pixel areas PXA2, and the third pixel areas PXA3 may have an arrangement relationship of a stripe structure as being arranged sequentially in the second direction DR2.

In FIG. 3, areas of the first pixel areas PXA1 and the third pixel areas PXA3 each are equal to each other, and although areas of the second pixel areas PXA2 are illustrated to be smaller than the areas of the first pixel areas PXA1 and the areas of the third pixel areas PXA3, the areas of the pixel areas according to an embodiment are not limited thereto. For example, the area of each of the third pixel areas PXA3 may be larger than the area of each of the first pixel areas PXA1, and the area of each of the first pixel areas PXA1 may be larger than the area of each of the second pixel areas PXA2.

The light blocking area NPXA may be disposed adjacent to the first pixel areas PXA1, the second pixel areas PXA2, and the third pixel areas PXA3. The light blocking area NPXA may set boundaries of the first pixel areas PXA1, the second pixel areas PXA2, and the third pixel areas PXA3. The light blocking area NPXA may prevent color mixing among the first pixel areas PXA1, the second pixel areas PXA2, and the third pixel areas PXA3. The light blocking area NPXA may prevent the source light from being provided to a user.

Figure 4:
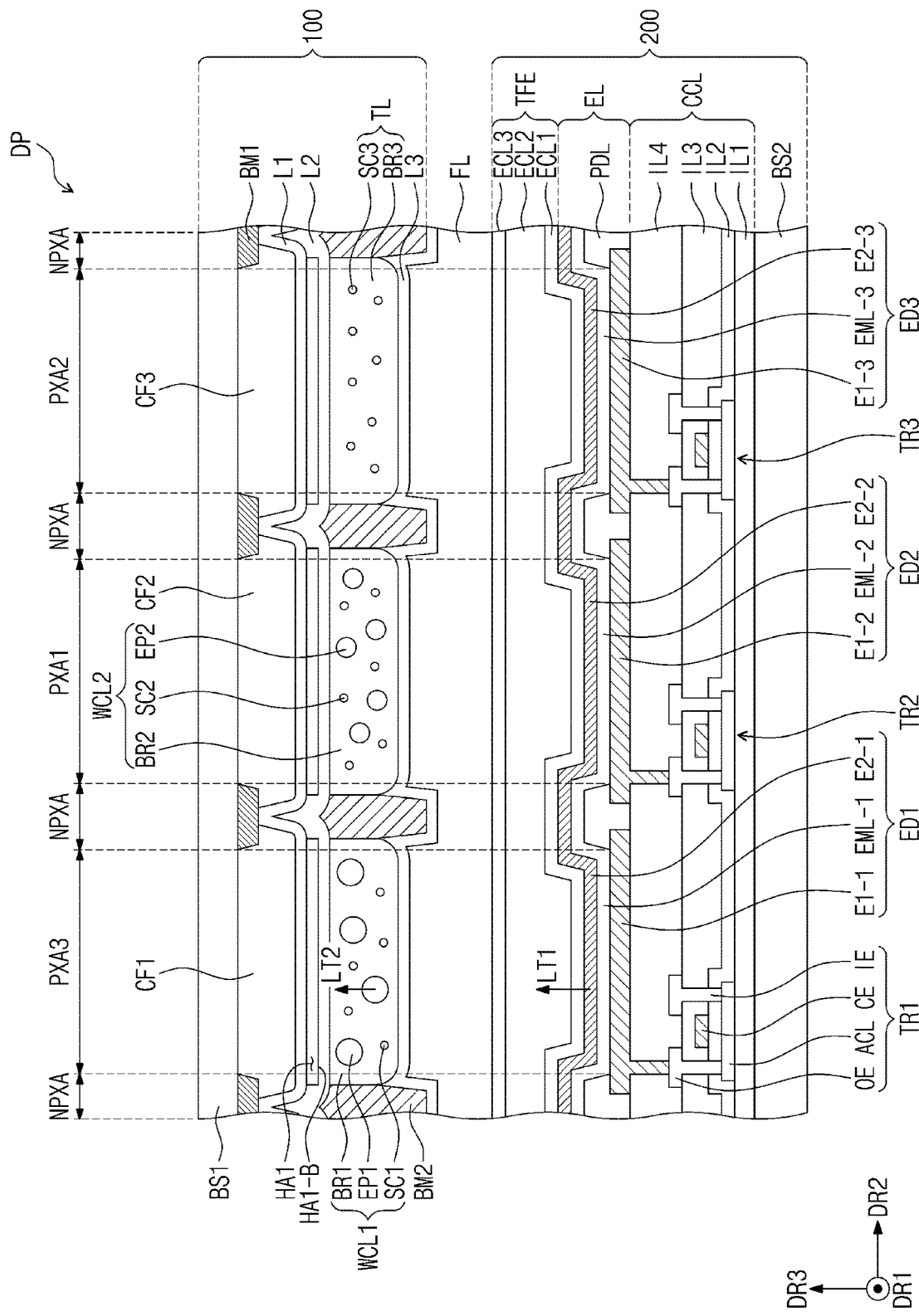
FIG. 4 is a schematic cross-sectional view of a display panel according to an embodiment.

FIG. 4 is a schematic cross-sectional view of a display panel according to an embodiment.

Referring to FIG. 4, the display panel DP according to an embodiment may be a light emitting display panel but is not particularly limited thereto. For example, the display panel DP may be an organic light emitting display panel, a nano LED display panel, a micro LED display panel, or a quantum dot light emitting display panel. An emission layer of the organic light emitting display panel may include an organic light emitting material. An emission layer of the quantum dot light emitting display panel may include a quantum dot and a quantum rod. Emission layers of the nano LED display panel and the micro LED display panel may include small LED elements having a size equal to or smaller than several hundred micrometers. Hereinafter, the display panel DP is described as an organic light emitting display panel.

The display panel DP may include a first substrate 100, a filling layer FL, and a second substrate 200. The first substrate 100 may be a light control substrate. The second substrate 200 may be a display substrate. For example, the first substrate 100 may include a wavelength conversion material and/or a material blocking a specific wavelength band. The second substrate 200 may provide light or control light transmittance.

The first substrate 100 and the second substrate 200 may face each other. The filling layer FL may be disposed between the first substrate 100 and the second substrate 200. The filling layer FL may fill a cell gap GP (see FIG. 2) between the first substrate 100 and the second substrate 200.

The first substrate 100 may include a base layer BS1, color filter layers CF1, CF2, and CF3, a light blocking layer BM1, light control layers WCL1, WCL2, TL, and barrier ribs BM2.

The base layer BS1 may be a silicon substrate, a plastic substrate, a glass substrate, an insulating film, or a laminate structure including insulating layers.

The light blocking layer BM1 may be disposed on a surface of the base layer BS1. The light blocking layer BM1 may define a light blocking area NPXA. The light blocking layer BM1 may not overlap the first pixel areas PXA1, the second pixel areas PXA2, and the third pixel areas PXA3.

The color filter layers CF1, CF2, and CF3 may include a first color filter layer CF1, a second color filter layer CF2, and a third color filter layer CF3. The first color filter layer CF1 may be disposed on a surface of the base layer BS1. The first color filter layer CF1 may be disposed under the base layer BS1. The first color filter layer CF1 may be a red color filter layer.

The second color filter layer CF2 may be disposed on a surface of the base layer BS1. The second color filter layer CF2 may be disposed under the base layer BS1. The second color filter layer CF2 may be a green color filter layer.

The third color filter layer CF3 may be disposed on a surface of the base layer BS1. The third color filter layer CF3 may be disposed under the base layer BS1. The third color filter layer CF3 may be a blue color filter layer.

The first color filter layer CF1 may be disposed in each of the third pixel areas PXA3. The second color filter layer CF2 may be disposed in each of the first pixel areas PXA1. The third color filter layer CF3 may be disposed in each of the second pixel areas PXA2.

A first protective layer L1 may cover or overlap the color filter layers CF1, CF2, and CF3, and the light blocking layer BM1. The first protective layer L1 may include an inorganic material. For example, the inorganic material may include any one among silicon oxide, silicon nitride, or silicon oxy nitride.

A second protective layer L2 may be disposed under the first protective layer L1. The second protective layer L2 may include an inorganic material. For example, the inorganic material may include any one among silicon oxide, silicon nitride, or silicon oxy nitride.

Light control layers WCL1, WCL2, and TL may include a first light control layer WCL1, a second light control layer WCL2, and a third light control layer TL. The light control layers WCL1, WCL2, and TL may be disposed under the second protective layer L2.

The first light control layer WCL1 may be disposed under the first color filter layer CF1. The first light control layer WCL1 may be disposed in the third pixel area PXA3. The first light control layer WCL1 may include a first base resin BR1, first scattering particles SC1, and a first luminous body EP1.

The second light control layer WCL2 may be disposed under the second color filter layer CF2. The second light control layer WCL2 may be disposed in the first pixel area PXA1. The second light control layer WCL2 may include a second base resin BR2, second scattering particles SC2, and a second luminous body EP2.

The third light control layer TL may be disposed under the third color filter layer CF3. The third light control layer TL may be disposed in the second pixel area PXA2. The third light control layer TL may include a third base resin BR3 and third scattering particles SC3.

The first to third base resins BR1, BR2, and BR3 are media in which luminous bodies or scattering particles are dispersed and may include (or be formed of) various resin compositions, which may be generally referred to as a binder. However, the embodiments are not limited thereto, and as long as the media are capable of dispersing the luminous bodies or scattering particles, the media may be referred to as a base resin regardless of names, additional functions, constituent materials, etc. For example, the base resin may be a polymer resin. As another example, the base resin may be an acrylic-based resin, a urethane-based resin, a silicone-based resin, an epoxy-based resin, etc. In an embodiment, the base resin may be a transparent resin.

The first to third scattering particles SC1, SC2, and SC3 may be $TiO_2$ or silica-based nanoparticles. The first to third scattering particles SC1, SC2, and SC3 may scatter light. Because of lack of a luminous body in the third light control layer, the amount of the third scattering particles SC3 included in the third light control layer TL may be equal to or greater than the amount of each of the first scattering particles SC1 included in the first light control layer WCL1 and second scattering particles SC2 included in the second light control layer WCL2. In another embodiment, the first and second scattering particles SC1 and SC2 may be omitted.

Each of the first luminous body EP1 and the second luminous body EP2 may be particles converting wavelengths of light. For example, each of the first luminous body EP1 and the second luminous body EP2 may be a quantum dot, a quantum rod, or a phosphor.

A quantum dot has a crystalline structure of a few nanometers in size, contains hundreds to thousands of atoms, and exhibits a quantum confinement effect in which the energy band gap is increased due to its small size. In case that light of a wavelength having greater energy than the band gap is incident on the quantum dot, the quantum dot absorbs the light to be excited and falls to a ground state while emitting light of a specific wavelength. The emitted light of the specific wavelength has a value corresponding to the band gap. In case that the quantum dot is adjusted in size and composition, light emitting properties due to the quantum confinement effect may be controlled.

The core of the quantum dot may include a Group II-VI compound, a Group III-VI compound, a Group compound, a Group III-V compound, a Group IV-VI compound, a Group IV element, a Group IV compound, or a combination thereof.

The Group II-VI compound may be selected from the group consisting of a binary compound selected from the group consisting of CdS, CdSe, CdTe, ZnS, ZnSe, ZnTe, ZnO, HgS, HgSe, HgTe, MgSe, MgS, and a mixture thereof, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-VI compound may include a binary compound such as $In_2S_3$ and $In_2Se_3$, a ternary compound such as $InGaS_3$ and $InGaSe_3$, or any combination thereof.

The Group semiconductor compound may include a ternary compound such as AgInS, $AgInS_2$, CuInS, $CuInS_2$, $AgGaS_2$, $CuGaS_2$, $CuGaO_2$, $AgGaO_2$, $AgAlO_2$, or any combination thereof.

The Group III-V compound may be selected from the group consisting of a binary compound selected from the group consisting of GaN, GaP, GaAs, GaSb, AlN, AlP, AlAs, AlSb, InN, InP, InAs, InSb, and a mixture thereof, a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof, and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The Group III-V compound may further include a Group II metal. For example, InZnP, etc. may be selected as a Group III-II-V compound.

The Group IV-VI compound may be selected from the group consisting of a binary compound selected from the group consisting of SnS, SnSe, SnTe, PbS, PbSe, PbTe, and a mixture thereof, a ternary compound selected from the group consisting of SnSeS, SnSeTe, SnSTe, PbSeS, PbSeTe, PbSTe, SnPbS, SnPbSe, SnPbTe, and a mixture thereof, and a quaternary compound selected from the group consisting of SnPbSSe, SnPbSeTe, SnPbSTe, and a mixture thereof. The Group IV element may be selected from the group consisting of Si, Ge, and a mixture thereof. The Group IV compound may be a binary compound selected from the group consisting of SiC, SiGe, and a mixture thereof.

In this case, a binary compound, a ternary compound, or a quaternary compound may be present in a particle with a uniform concentration distribution or may be present in the same particle with a partially different concentration. The quantum dot may have a core/shell structure in which a quantum dot surrounds another quantum dot. An interface between a core and a shell may have a concentration gradient in which the concentration of an element present in the shell becomes lower toward the center.

In some embodiments, a quantum dot may have a core/shell structure including a core having nano-crystals and a shell surrounding the core described above. The shell of the quantum dot may function as a protection layer to prevent the chemical deformation of the core so as to maintain semiconductor properties, and/or a charging layer to impart electrophoresis properties to the quantum dot. The shell may be a single layer or a multilayer. An interface between the core and the shell may have a concentration gradient in which the concentration of an element present in the shell becomes lower toward the center. An example of the quantum dot shell may be a metal or non-metal oxide, a semiconductor compound, or a combination thereof.

For example, the metal or non-metal oxide may be a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO, or a ternary compound such as $MgAl_2O_4$, $CoFe_2O_4$, $NiFe_2O_4$, and $CoMn_2O_4$ but the embodiments are not limited thereto.

The semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but the embodiments are not limited thereto.

A quantum dot may have a full width of half maximum (FWHM) of a light emitting wavelength spectrum equal to or smaller than about 45 nm, preferably about 40 nm, more preferably about 30 nm, and the color purity or color reproducibility may be improved in the above ranges. Light emitted through such a quantum dot is emitted in all directions so that a wide viewing angle may be improved.

The form of a quantum dot is not particularly limited as long as it is commonly used in the art. For example, a quantum dot in the form of spherical, pyramidal, multi-arm, or cubic nanoparticles, nanotubes, nanowires, nanofibers, nanoplates particles, etc. may be used. However, the embodiments are not limited thereto and may include any form commonly used in the art.

A quantum dot may control the color of emitted light according to the particle size thereof and thus the quantum dot may have various light emission colors such as green, red, etc.

According to an embodiment, in case that the first luminous body EP1 and the second luminous body EP2 are quantum dots, the particle size of the first luminous body EP1 and the particle size of the second luminous body EP2 may be different from each other. For example, the particle size of the first luminous body EP1 may be larger than the particle size of the second luminous body EP2. In this case, the first light luminous body EP1 may emit light having a longer wavelength than the second luminous body EP2.

The first light control layer WCL1 may convert blue light into red light to provide the converted light to the first color filter layer CF1. The first color filter layer CF1 may transmit light in a wavelength range of red light and may absorb other light.

The second light control layer WCL2 may convert blue light into green light to provide the converted light to the second color filter layer CF2. The second color filter layer CF2 may transmit light in a wavelength range of green light and may absorb other light.

The third light control layer TL may scatter blue light to provide the scattered light to the third color filter layer CF3. The third color filter layer CF3 may transmit light in a wavelength range of blue light and may absorb other light.

The third protective layer L3 may be disposed under the light control layers WCL1, WCL2, and TL. The third protective layer L3 may cover or overlap the light control layers WCL1, WCL2, and TL. The third protective layer L3 may include any one among silicon oxide, silicon nitride, or silicon oxy nitride. In another embodiment, the third protective layer L3 may be omitted.

A first opening HA1 may be defined among the first to third color filter layers CF1, CF2, and CF3, and the light control layers WCL1, WCL2, and TL. For example, the first opening HA1 may be defined between the first protective layer L1 and the second protective layer L2.

The first to third color filter layers CF1, CF2, and CF3, and the light control layers WCL1, WCL2, and TL may be spaced apart from each other in the third direction DR3 with the first opening HA1 therebetween.

In a plan view, the first to third color filter layers CF1, CF2, CF3, the light control layers WCL1, WCL2, and TL, and the first opening HA1 may overlap each other.

Air may be disposed inside the first opening HA1.

The refractive index inside the first opening HA1 may be smaller than the refractive index of the light control layers WCL1, WCL2, and TL. The refractive index of the first opening HA1 (or the material in the first opening HA1 such as air) may be smaller than the refractive index of the first to third color filter layers CF1, CF2, and CF3. The refractive index inside the first opening HA1 may be about 1 to about 1.1. For example, the refractive index inside the first opening HA1 may be about 1.

In a plan view, the first opening HA1 may be defined in the first to third pixel areas PXA1, PXA2, and PXA3.

Barrier ribs BM2 may be spaced apart from each other with the light control layers WCL1, WCL2, and TL therebetween. The barrier ribs BM2 may overlap the light blocking layer BM1.

The second substrate 200 may include a base layer BS2, a circuit layer CCL, a light emitting element layer EL, and a thin film encapsulation layer TFE. The circuit layer CCL may be disposed on the base layer BS2. The circuit layer CCL may include insulating layers, conductive layers, and a semiconductor layer. The light emitting element layer EL may be disposed on the circuit layer CCL. The thin film encapsulation layer TFE may overlap or seal the light emitting element layer EL. In an embodiment, the thin film encapsulation layer TFE may be omitted.

The base layer BS2 may be a silicon substrate, a plastic substrate, a glass substrate, an insulating film, or a laminate structure including insulating layers.

The circuit layer CCL may include first to third transistors TR1, TR2, and TR3, and insulating layers IL1, IL2, IL3, and IL4. The insulating layers IL1, IL2, IL3, and IL4 may include a first insulating layer IL1, a second insulating layer IL2, a third insulating layer IL3, and a fourth insulating layer IL4.

The first insulating layer IL1 may be disposed on the base layer BS2, and the first to third transistors TR1, TR2, and TR3 may be disposed on the first insulating layer IL1, The first to third transistors TR1, TR2, and TR3 may have substantially the same structure. Therefore, the first transistor TR1 is described as a representative. The first transistor TR1 may include a control electrode CE, an input electrode IE, an output electrode OE, and a semiconductor layer ACL.

The semiconductor layer ACL may be disposed on the first insulating layer ILL The first insulating layer IL1 may be a buffer layer providing a modified surface to the semiconductor layer ACL. In this case, the semiconductor layer ACL may have a higher adhesion to the first insulating layer IL1 than the base layer BS2. The first insulating layer IL1 may protect a lower surface of the semiconductor layer ACL. In this case, the first insulating layer IL1 may prevent the base layer BL2 itself or may prevent contamination or moisture introduced through the base layer BL2 from penetrating into the semiconductor layer ACL. As another example, the first insulating layer IL1 may be a light blocking layer blocking external light incident through the base layer BS2 from entering the semiconductor layer ACL. In this case, the first insulating layer IL1 may further include a light blocking material.

The semiconductor layer ACL may include polysilicon or amorphous silicon. The semiconductor layer ACL may include a metal oxide semiconductor. The semiconductor layer ACL may include a channel area function as a passage through which electrons or holes may move, and a first doped area and a second doped area disposed with the channel area therebetween.

The second insulating layer IL2 may be disposed on the first insulating layer ILL The second insulating layer IL2 may cover or overlap the semiconductor layer ACL. The second insulating layer IL2 may include an inorganic material. The inorganic material may include at least any one among silicon nitride, silicon oxy nitride, silicon oxide, titanium oxide, and aluminum oxide.

The control electrode CE may be disposed on the second insulating layer IL2. The third insulating layer IL3 may be disposed on the second insulating layer IL2 and may overlap the control electrode CE. The third insulating layer IL3 may include (or be formed of) a single layer or multiple layers. For example, the single layer may include an inorganic layer. The layers may include an organic layer and an inorganic layer.

The input electrode IE and the output electrode OE may be disposed on the third insulating layer IL3. The input electrode IE and the output electrode OE may be electrically connected to the semiconductor layer ACL via through holes penetrating the second insulating layer IL2 and the third insulating layer IL3.

The fourth insulating layer IL4 may be disposed on the third insulating layer IL3 and may overlap or cover the input electrode IE and the output electrode OE. The fourth insulating layer IL4 may include (or be formed of) a single layer or a multiple layers. For example, the single layer may include an organic layer. The layers may include an organic layer and an inorganic layer. The fourth insulating layer IL4 may be a planarization layer providing a flat upper surface.

The light emitting element layer EL may be disposed on the fourth insulating layer IL4. The light emitting element layer EL may include light emitting elements ED1, ED2 and ED3, and a pixel defining film PDL.

The light emitting elements ED1, ED2, and ED3 may overlap the first opening HAL the color filter layers CF1, CF2, and CF3, and the light control layers WCL1, WCL2, and TL, respectively. The light emitting elements ED1, ED2, and ED3 may include a first light emitting element ED1, a second light emitting element ED2, and a third light emitting element ED3.

The first light emitting element ED1 may be disposed corresponding to the third pixel area PXA3. The first light emitting element ED1 may overlap the third pixel area PXA3 in a plan view. The first light emitting element ED1 may include a first electrode E1-1, a first emission layer EML-1, and a second electrode E2-1.

The second light emitting element ED2 may be disposed corresponding to the first pixel area PXA1. The second light emitting element ED2 may overlap the first pixel area PXA1 in a plan view. The second light emitting element ED2 may include a first electrode E1-2, a second emission layer EML-2, and a second electrode E2-2.

The third light emitting element ED3 may be disposed corresponding to the second pixel area PXA2. The third light emitting element ED3 may overlap the second pixel area PXA2 in a plan view. The third light emitting element ED3 may include a first electrode E1-3, a third emission layer EML-3, and a second electrode E2-3.

The first electrodes E1-1, E1-2, and E1-3 may be disposed on the fourth insulating layer IL4. The first electrodes E1-1, E1-2, and E1-3 may be electrically connected to the first to third transistors TR1, TR2, and TR3, respectively, via through holes.

The pixel defining film PDL may expose at least portions of each of the first electrodes E1-1, E1-2, and E1-3. The pixel defining film PDL may overlap barrier ribs BM2. The pixel defining film PDL may overlap a light blocking layer BM1.

The first to third emission layers EML-1, EML-2, and EML-3 according to an embodiment may be connected to one another to form an emission layer (or may be integral with each other). For example, the first to third emission layers EML-1, EML-2, and EML-3 may be disposed on the pixel defining film PDL and the first electrodes E1-1, E1-2, and E1-3. The first to third emission layers EML-1, EML-2, and EML-3 may generate blue light. The first to third emission layers EML-1, EML-2, and EML-3 may have a tandem structure or a single-layer structure.

The second electrodes E2-1, E2-2, and E2-3 may be connected to one another to form a second electrode (or may be integral with each other). The second electrodes E2-1, E2-2, and E2-3 may be disposed on the first to third emission layers EML-1, EML-2, and EML-3, respectively.

Although not separately illustrated, a hole control layer may be disposed between the first electrode and the emission layer, and an electron control layer may be disposed between the emission layer and the second electrode. The hole control layer may be classified as at least one among a hole injection region, a hole transport region, a buffer region, and an electron blocking region. The electron control layer may be classified as at least one among an electron injection region, an electron transport region, and a hole blocking region.

The thin film encapsulation layer TFE may be disposed on the second electrodes E2-1, E2-2, and E2-3. The thin film encapsulation layer TFE may cover or overlap the second electrodes E2-1, E2-2, and E2-3. In another embodiment, a capping layer overlapping the second electrodes E2-1, E2-2, and E2-3 may be further disposed between the thin film encapsulation layer TFE and the second electrodes E2-1, E2-2, and E2-3. In another embodiment, the thin film encapsulation layer TFE may be omitted.

The thin film encapsulation layer TFE may include a first inorganic layer ECL1, an organic layer ECL2, and a second inorganic layer ECL3, which are sequentially stacked. The organic layer ECL2 may be disposed between the first inorganic layer ECL1 and the second inorganic layer ECL3. The first inorganic layer ECL1 and the second inorganic layer ECL3 may be formed through depositing an inorganic material, and the organic layer ECL2 may be formed through depositing, printing, or coating an organic material.

The first inorganic layer ECL1 and the second inorganic layer ECL3 protect the light emitting element layer EL from moisture and oxygen, and the organic layer ECL2 protects the light emitting element layer EL from foreign substances such as dust particles. The first inorganic layer ECL1 and the second inorganic layer ECL3 may include at least any one among silicon nitride, silicon oxynitride, silicon oxide, titanium oxide, and aluminum oxide. The organic layer ECL2 may include a polymer, for example, an acrylic-based organic layer. However, this is present as an example, and the embodiments are not limited thereto.

In FIG. 4, the thin film encapsulation layer TFE is illustrated to include two inorganic layers and an organic layer as an example but is not limited thereto. For example, the thin film encapsulation layer TFE may include three inorganic layers and two organic layers, and in this case, the inorganic layer and the organic layer may have a structure of being alternately stacked. As another example, the thin film encapsulation layer TFE may be provided as a single layer.

The filling layer FL may be disposed between a lower surface of each of the third protective layer L3 and the barrier ribs BM2, and an upper surface of the second inorganic layer ECL3. The filling layer FL may be disposed between the thin film encapsulation layer TFE and the light control layers WCL1, WCL2, and TL to prevent the light control layers WCL1, WCL2, and TL from contacting the thin film encapsulation layer TFE, thereby improving light output efficiency of the display panel DP. The filling layer FL may be formed between the thin film encapsulation layer TFE and the light control layers WCL1, WCL2, and TL to prevent an inner space from being created between the thin film encapsulation layer TFE and the light control layers WCL1, WCL2, and TL.

The filling layer FL may prevent luminous bodies and/or scattering particles included in the light control layers WCL1, WCL2, and TL from being oxidized by internal air, and thus increasing light output efficiency of the display panel DP.

The filling layer FL may include an inorganic binder, an organic binder, or a liquid crystal compound. However, this is presented as an example, and the material of the filling layer FL according to an embodiment is not limited thereto.

The display panel DP may be manufactured by bonding a first substrate 100, a filling layer FL, and a second substrate 200 to each other.

The light emitting elements ED1, ED2, and ED3 may provide first light LT1 to the first substrate 100. For example, the first light LT1 may be blue light. The first light LT1 may be referred to as source light. The first light LT1 may be provided to the light control layers WCL1, WCL2, and TL.

The first light LT1 passing through the light control layers WCL1, WCL2, and TL may be defined as second light LT2. The second light LT2 may include the first light LT1 and light which is the converted first light LT1 by the luminous bodies EP1 and EP2. For example, the second light LT2 may include at least one among red light, green light, and blue light. The second light LT2 may be provided to the color filter layers CF1, CF2, and CF3.

In an embodiment, the second light LT2 may be provided to the first opening HA1 from the light control layers WCL1, WCL2, and TL. The first opening HA1 may be filled with air. The refractive index of the light control layers WCL1, WCL2, and TL may be higher than the refractive index of inside the first opening HAL A part of the second light LT2 may be totally reflected on a plane (or layer) HA1-B defining the first opening HA1. The light that is not converted by the light control layers WCL1, WCL2, and TL in the part of the totally reflected second light LT2 is converted in the light control layers WCL1, WCL2, and TL, and is re-provided to the color filter layers CF1, CF2, and CF3. Accordingly, a display panel DP having improved light output efficiency may be provided.

The second light LT2 passing through the first light control layer WCL1 may include red light and blue light. In case that the second light LT2 is provided to the first color filter layer CF1, the blue light is absorbed, and thus the light output efficiency of the display panel DP may be reduced. However, in an embodiment, a first part of the second light LT2 totally reflected in the first opening HA1 overlapping the first light control layer WCL1 may include red light and blue light. The first light control layer WCL1 may convert blue light into red light among the first part of the totally reflected second light LT2 to provide the converted light back to the first color filter layer CF1.

The second light LT2 passing through the second light control layer WCL2 may include green light and blue light. In case that the second light LT2 is provided to the second color filter layer CF2, the blue light is absorbed, and thus the light output efficiency of the display panel DP may be reduced. However, in an embodiment, a second part of the second light LT2 totally reflected in the first opening HA1 overlapping the second light control layer WCL2 may include green light and blue light. The second light control layer WCL2 may convert blue light into green light among the second part of the totally reflected second light LT2 to provide the converted light back to the second color filter layer CF2.

Table 1 compares light output efficiency based on refractive indices according to an embodiment.

TABLE 1

|  | Refractive index | light output efficiency (%) |
|---|---|---|
| Comparative Example 1 | 1.23 | 100.0% |
| Comparative Example 2 | 1.19 | 106.0% |
| Example | 1.00 | 128.5% |

Referring to Table 1 and FIG. 4, Comparative Example 1 of Table 1 may be a display panel having a first low refractive layer with a refractive index of about 1.23 between the color filter layers CF1, CF2, and CF3 and the light control layers WCL1, WCL2, and TL. First light output efficiency of Comparative Example 1 may be set to a reference value of about 100.0%. Comparative Example 2 of Table 1 may be a display panel having a second low refractive layer with a refractive index of about 1.19 between the color filter layers CF1, CF2, and CF3 and the light control layers WCL1, WCL2, and TL, wherein the refractive index is lower than that of the first low refractive layer. Second light output efficiency of Comparative Example 2 may be about 106.0%, which is higher than the first light output efficiency.

Example of Table 1 may be a display panel DP according to an embodiment. A first opening HA1 may be defined between the color filter layers CF1, CF2, and CF3 and the light control layers WCL1, WCL2, and TL, and the refractive index inside the first opening HA1 may be about 1.00. The refractive index inside the first opening HA1 may be lower than the refractive index of each of the first low refractive layer and the second low refractive layer. Third light output efficiency of Example may be about 128.5%, which is higher than each of the first light output efficiency and the second light output efficiency. According to the disclosure, a display panel DP having improved light output efficiency may be provided.

Figure 5A:
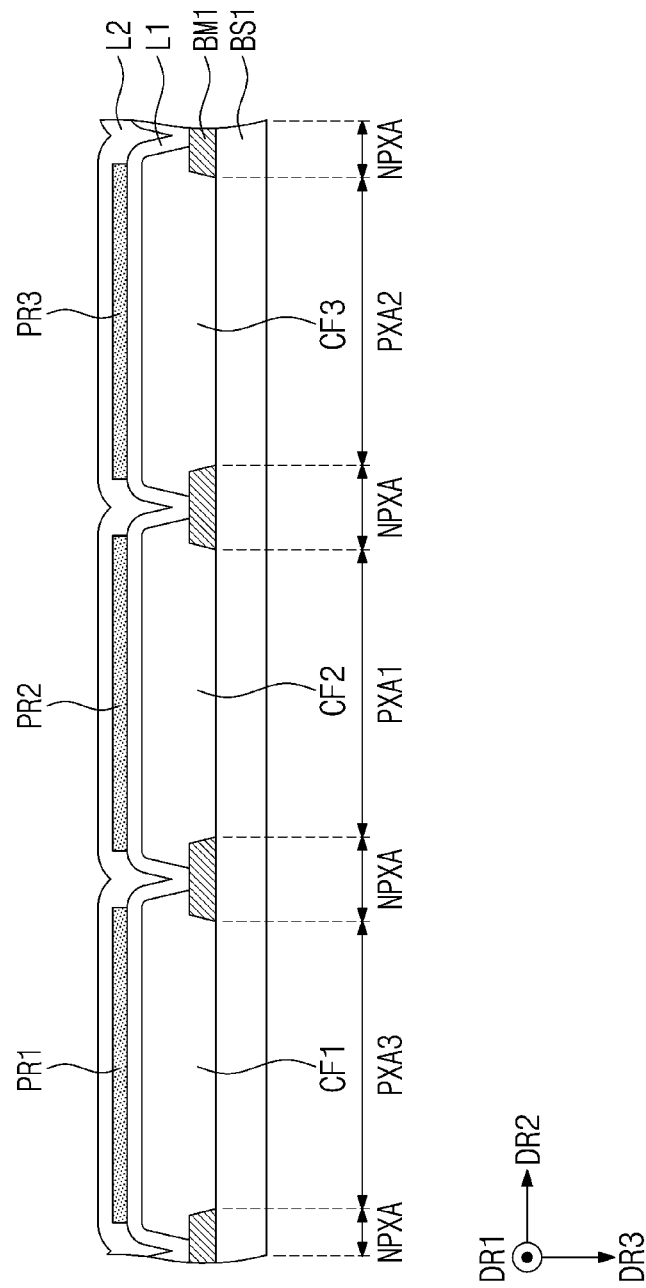
FIGS. 5A to 5C are schematic cross-sectional views illustrating a part of a method for manufacturing a display panel according to an embodiment.
Figure 5B:
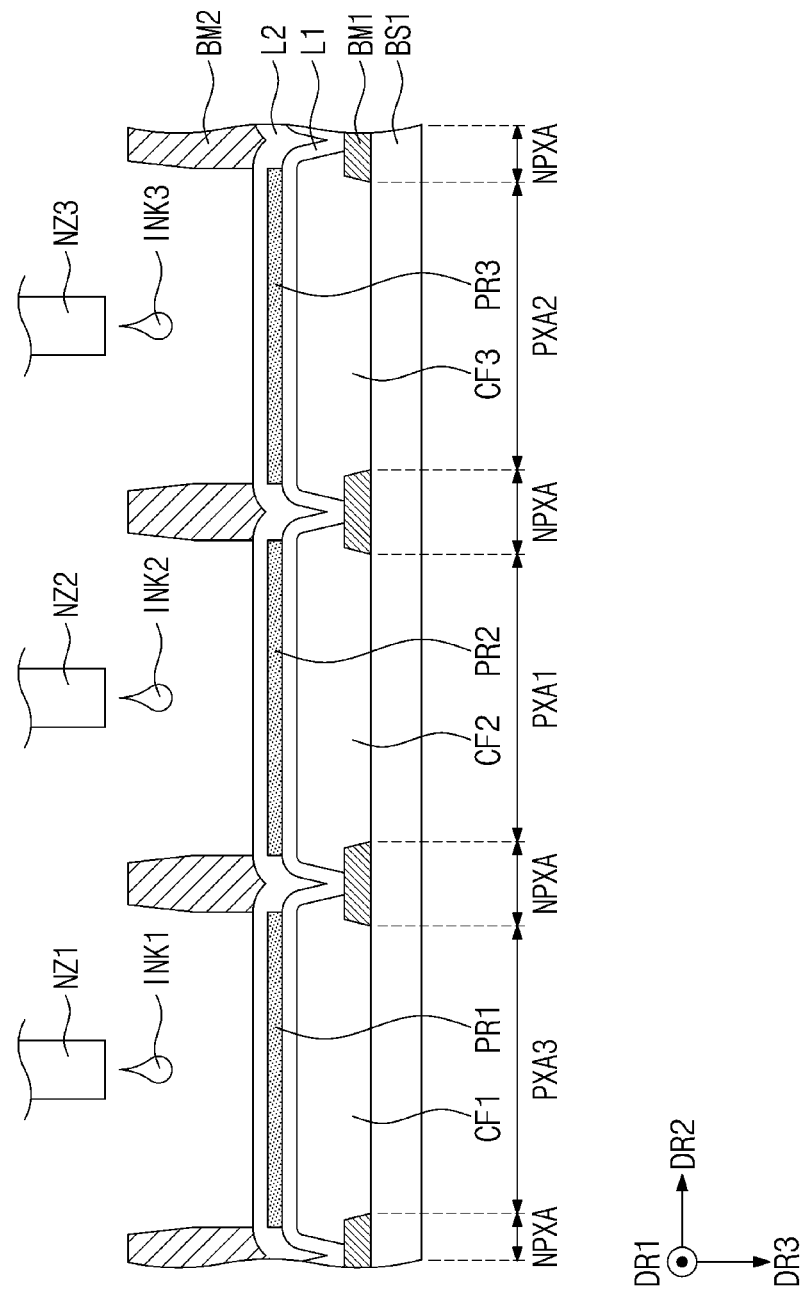
Figure 5C:
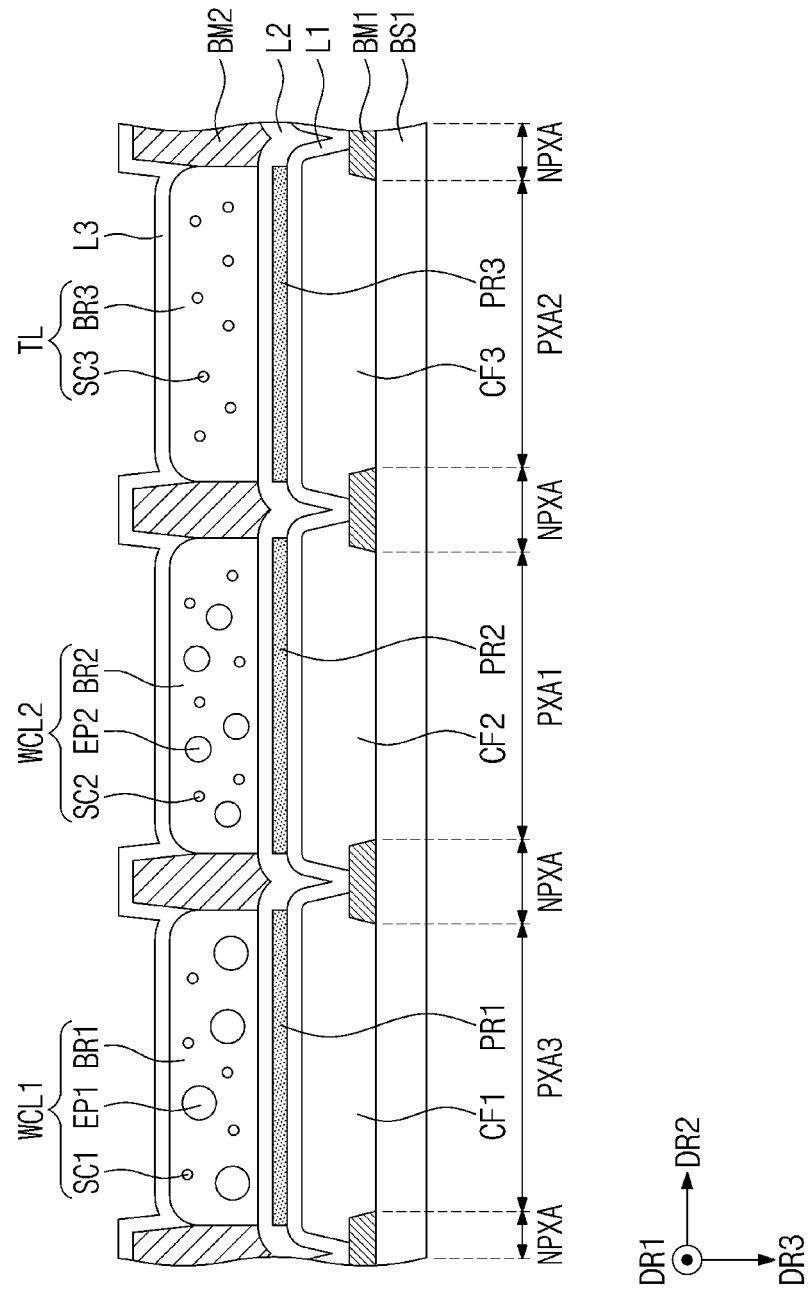

FIGS. 5A to 5C are schematic cross-sectional views illustrating a part of a method for manufacturing a display panel according to an embodiment.

Referring to FIG. 5A, a method for manufacturing a display panel DP (see FIG. 4) may include forming a first substrate 100 (see FIG. 4). A light blocking layer BM1 may be formed on a base layer BS1. The light blocking layer BM1 may overlap a light blocking area NPXA. The light blocking layer BM1 and any one of color filter layers CF1, CF2, and CF3 may include (or be formed of) the same material. For example, the light blocking layer BM1 and the third color filter layer CF3 may include the same material.

The color filter layers CF1, CF2, and CF3 may be formed on the base layer BS1. The color filter layers CF1, CF2, and CF3 may overlap pixel areas PXA1, PXA2, and PXA3. The first color filter layer CF1, the second color filter layer CF2, and the third color filter layer CF3 may be spaced apart from one another in the second direction DR2. However, this is presented as an example, and the arrangement relationship of the color filter layers CF1, CF2, and CF3 according to an embodiment is not limited thereto. For example, portions of each of the first color filter layer CF1, the second color filter layer CF2, and the third color filter layer CF3 may be disposed to overlap one another.

A first protective layer L1 may be formed on the color filter layers CF1, CF2, and CF3. The first protective layer L1 may overlap or cover the light blocking layer BM1 and the color filter layers CF1, CF2, and CF3.

After the color filter layers CF1, CF2, and CF3 are formed, photoresist layers PR1, PR2, and PR3 may be formed on the first protective layer L1. The photoresist layers PR1, PR2, and PR3 may include a first photoresist layer PR1, a second photoresist layer PR2, and a third photoresist layer PR3. The photoresist layers PR1, PR2, and PR3 may overlap the color filter layers CF1, CF2, and CF3, respectively. For example, the first photoresist layer PR1 may overlap the first color filter layer CF1, the second photoresist layer PR2 may overlap the second color filter layer CF2, and the third photoresist layer PR3 may overlap the third color filter layer CF3.

A second protective layer L2 may be formed on the photoresist layers PR1, PR2, and PR3. The second protective layer L2 may overlap or cover the first protective layer L1 and the photoresist layers PR1, PR2, and PR3. The second protective layer L2 may be referred to as an encapsulation layer L2.

Referring to FIG. 5B, after the second protective layer L2 is formed, barrier ribs BM2 may be formed on the second protective layer L2. The barrier ribs BM2 in the light blocking area NPXA may overlap the light blocking area NPXA. The barrier ribs BM2 may not overlap the pixel areas PXA1, PXA2, and PXA3.

After the barrier ribs BM2 are formed, a first nozzle NZ1 may provide first ink INK1 to the third pixel area PXA3. The first ink INK1 may form a first light control layer WCL1 (see FIG. 4). A second nozzle NZ2 may provide second ink INK2 to the first pixel area PXA1. The second ink INK2 may form a second light control layer WCL2 (see FIG. 4). A third nozzle NZ3 may provide third ink INK3 to the second pixel area PXA2. The third ink INK3 may form a third light control layer TL (see FIG. 4).

The first ink INK1, the second ink INK2, and the third ink INK3 may be provided simultaneously.

Referring to FIG. 5C, light control layers WCL1, WCL2, and TL may be formed on the photoresist layers PR1, PR2, and PR3, respectively. The light control layers WCL1, WCL2, and TL may be disposed between barrier ribs BM2.

The light control layers WCL1, WCL2, and TL may be formed by an inkjet process.

A third protective layer L3 may be formed on the light control layers WCL1, WCL2, and TL, and the barrier ribs BM2. The third protective layer L3 may cover or overlap the light control layers WCL1, WCL2, and TL, and the barrier ribs BM2.

Figure 5D:
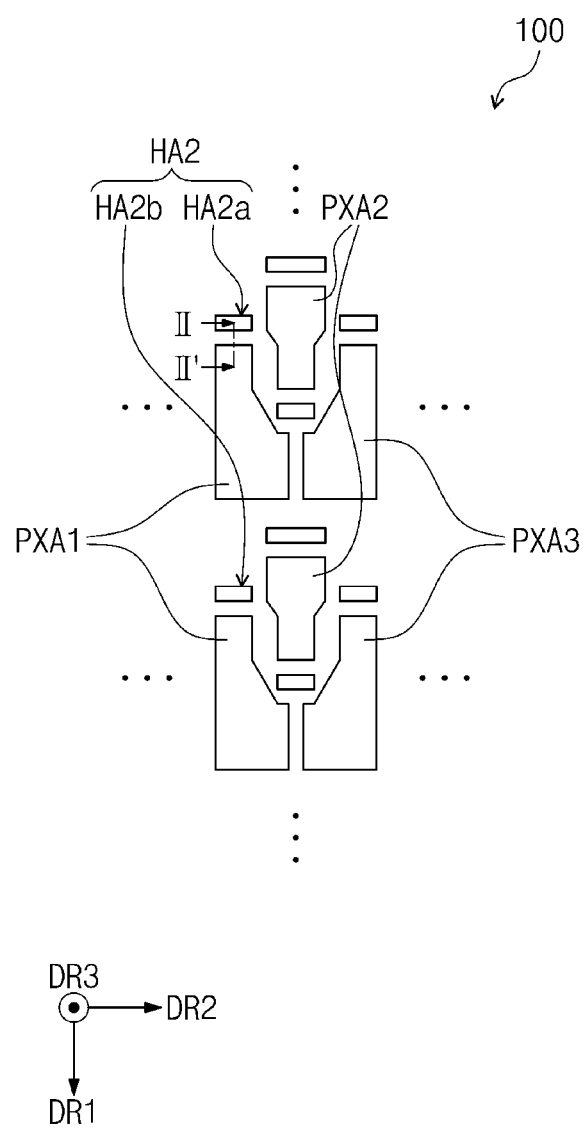
FIG. 5D is a schematic plan view illustrating a part of a method for manufacturing a display panel according to an embodiment.
Figure 5E:
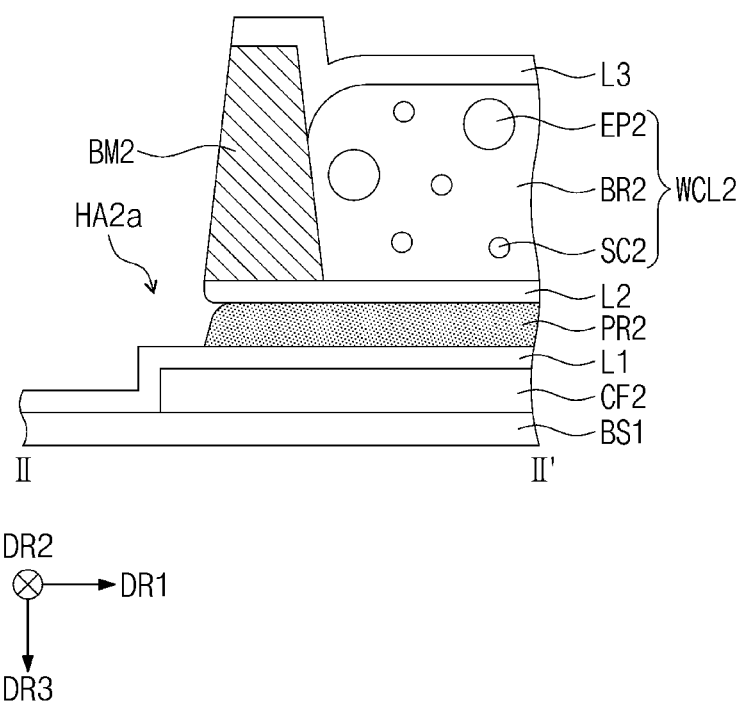
FIG. 5E is a schematic cross-sectional view taken along line II-II' of FIG. 5D according to an embodiment.

FIG. 5D is a schematic plan view illustrating a part of a method for manufacturing a display panel according to an embodiment, and FIG. 5E is a schematic cross-sectional view taken along line II-II' of FIG. 5D according to an embodiment.

Referring to FIGS. 5D and 5E, after the third protective layer L3 is formed, a portion of the second protective layer L2 and a portion of the third protective layer L3 in an area adjacent to the pixel areas PXA1, PXA2, and PXA3 may be removed. A second opening HA2 may be formed by the removed portion of the second protective layer L2.

The second opening HA2 may not overlap the light control layers WCL1, WCL2, and TL. The second opening HA2 may be defined in an area adjacent to the pixel areas PXA1, PXA2, and PXA3. For example, a second opening HA2 may be formed in an adjacent area of the first pixel area PXA1; two second openings HA2 may be formed in an adjacent region of the second pixel area PXA2; and a second opening HA2 may be formed in an adjacent area of the third pixel area PXA3.

The second openings HA2 may be spaced apart from each other with the pixel areas PXA1, PXA2, and PXA3 therebetween. For example, a second opening HA2$a$ may be formed in an area adjacent to the first pixel area PXA1, and a second opening HA2$b$ may be formed in an area adjacent to the other first pixel area PXA1. The second opening HA2$b$ may be referred to as a third opening HA2$b$.

A second opening HA2 may be formed in an area adjacent to the first pixel area PXA1. Two second openings HA2 may be formed in an area adjacent to the second pixel area PXA2. The two second openings HA2 may be spaced apart from each other with the second pixel area PXA2 therebetween. A second opening HA2 may be formed in an area adjacent to the third pixel area PXA3. However, this is presented as an example, and in an embodiment, the same number of the second openings HA2 may be provided in each of the pixel areas, or different numbers of the second openings HA2 may be provided in each of the pixel areas.

The second openings HA2$a$ and HA2$b$ may be spaced apart from each other in the first direction DR1. The second openings HA2$a$ and HA2$b$ may be provided with the second photoresist layer PR2 therebetween.

Steps before the forming of the second opening HA2 may be performed at a temperature equal to or less than a predetermined temperature. For example, the predetermined temperature may be about 150° C. The photoresist layers PR1, PR2, and PR3 manufactured below the predetermined temperature are not cured and may thus be easily removed.

After the second opening HA2 is formed, the first opening HA1 (see FIG. 4) may be formed. The first opening HA1 (see FIG. 4) may be formed by removing the photoresist layers PR1, PR2, and PR3 through the second opening HA2. For example, a side surface of the second photoresist layer PR2 may be exposed by the second opening HA2$a$.

A photoresist removal solution may be provided in the second opening HA2$a$. The photoresist removal solution may remove the second photoresist layer PR2.

The second photoresist layer PR2 is removed, and thus the second openings HA2$a$ and HA2$b$ may be connected to each other. In an embodiment, the first opening HA1 and the second openings HA2$a$ and HA2$b$ may be connected to one another. The photoresist removal solution is provided to the first opening HA1 through one of the second openings HA2$a$ or HA2$b$ to be discharged from the first opening HA1 through the other of the second openings HA2$a$ and HA2$b$. In this case, removing the photoresist layers PR1, PR2, and PR3 may be performed better than in case that the photoresist removal solution is provided to the first opening HA1 through a second opening HA2.

Figure 5F:
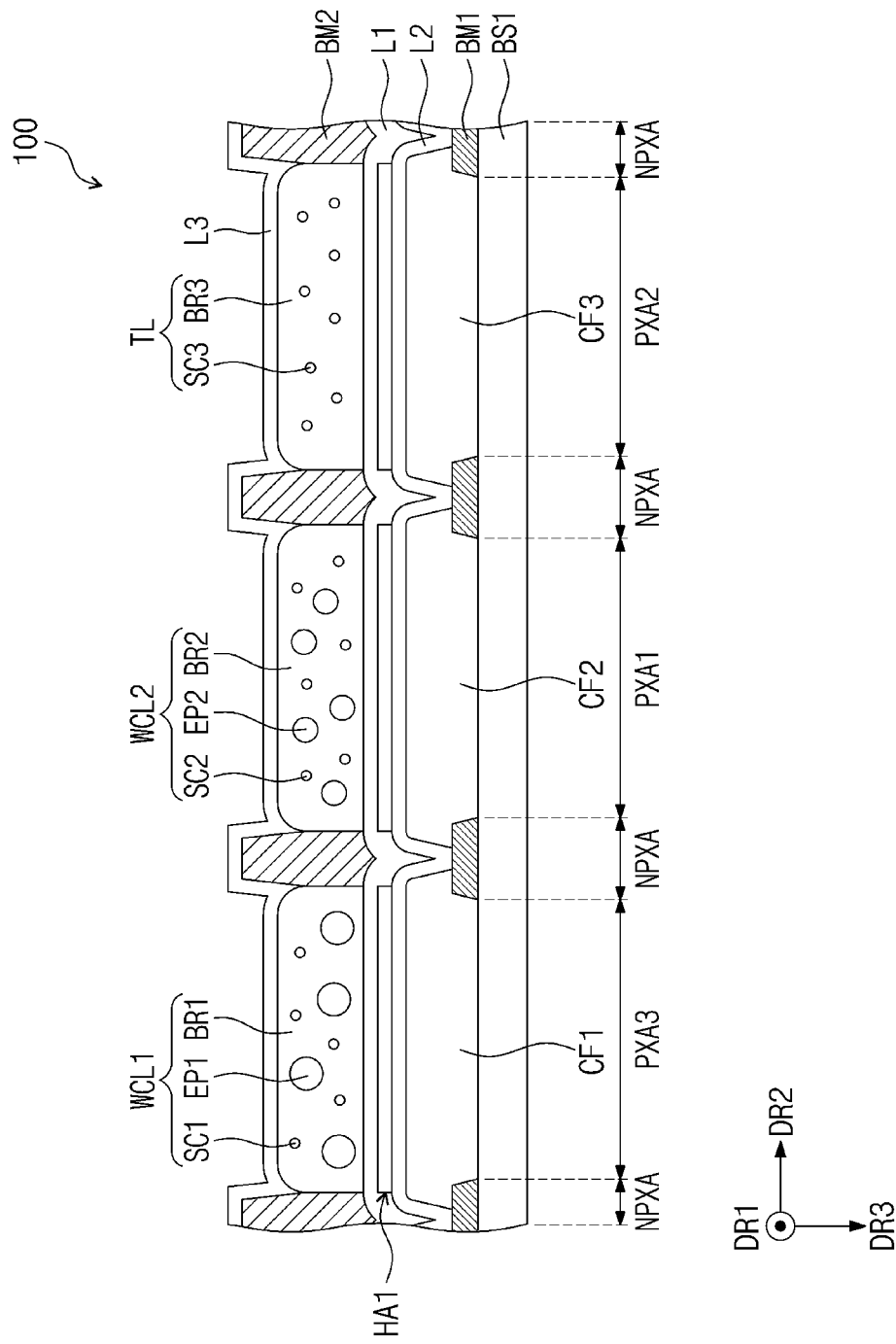
FIG. 5F is a schematic cross-sectional view illustrating a part of a method for manufacturing a display panel according to an embodiment.

FIG. 5F is a schematic cross-sectional view illustrating a part of a method for manufacturing a display panel according to an embodiment.

Referring to FIG. 5F, an area in which the photoresist layers PR1, PR2, and PR3 are disposed may be removed to form a first opening HA1. The first opening HA1 may be filled with air.

After the first opening HA1 is formed, a first substrate 100 may be bonded to a second substrate 200 (see FIG. 4) to manufacture a display panel DP (see FIG. 4).

FIGS. 6A to 6D are schematic cross-sectional views illustrating a part of a method for manufacturing a display panel according to an embodiment.

Figure 6A:
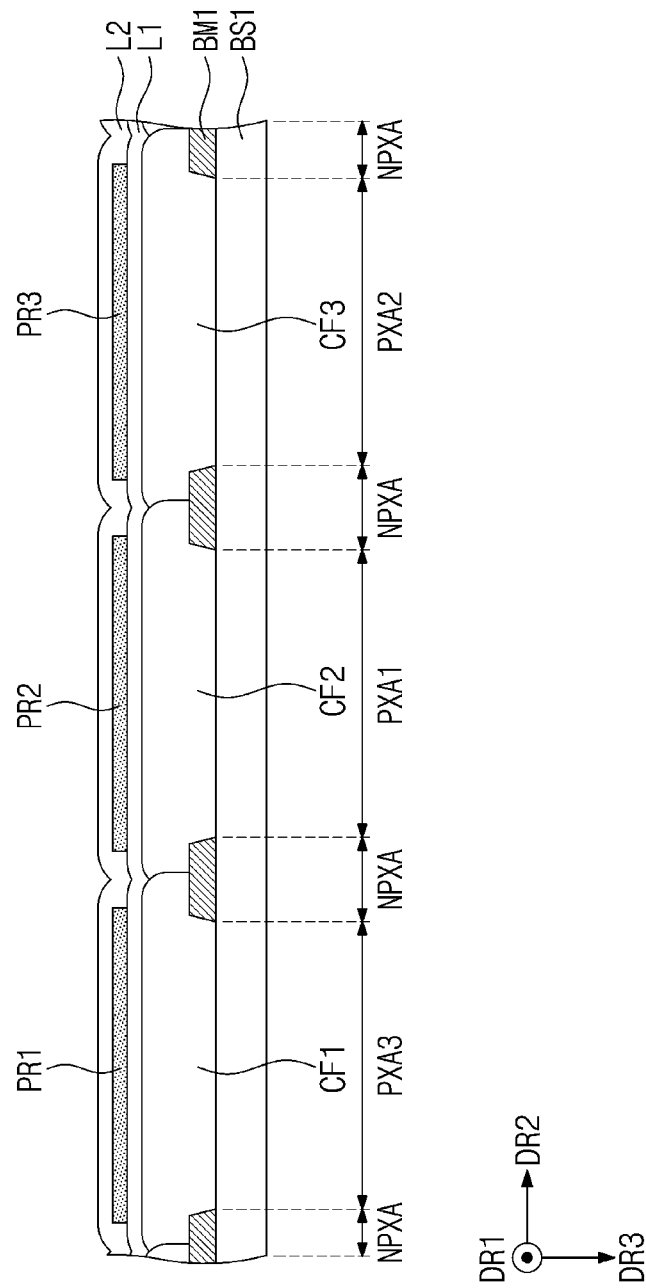

Referring to FIG. 6A, a light blocking layer BM1 may be formed on a base layer BS1. A first color filter layer CF1, a second color filter layer CF2, and a third color filter layer CF3 may be formed on the light blocking layer BM1. At least portions of the first color filter layer CF1, the second color filter layer CF2, and the third color filter layer CF3 may overlap one another. However, this is presented as an example, and the first color filter layer CF1, the second color filter layer CF2, and the third color filter layer CF3 according to an embodiment may be spaced apart from one another and not overlap each. A first protective layer L1 may be formed on the first color filter layer CF1, the second color filter layer CF2, and the third color filter layer CF3.

Figure 6B:
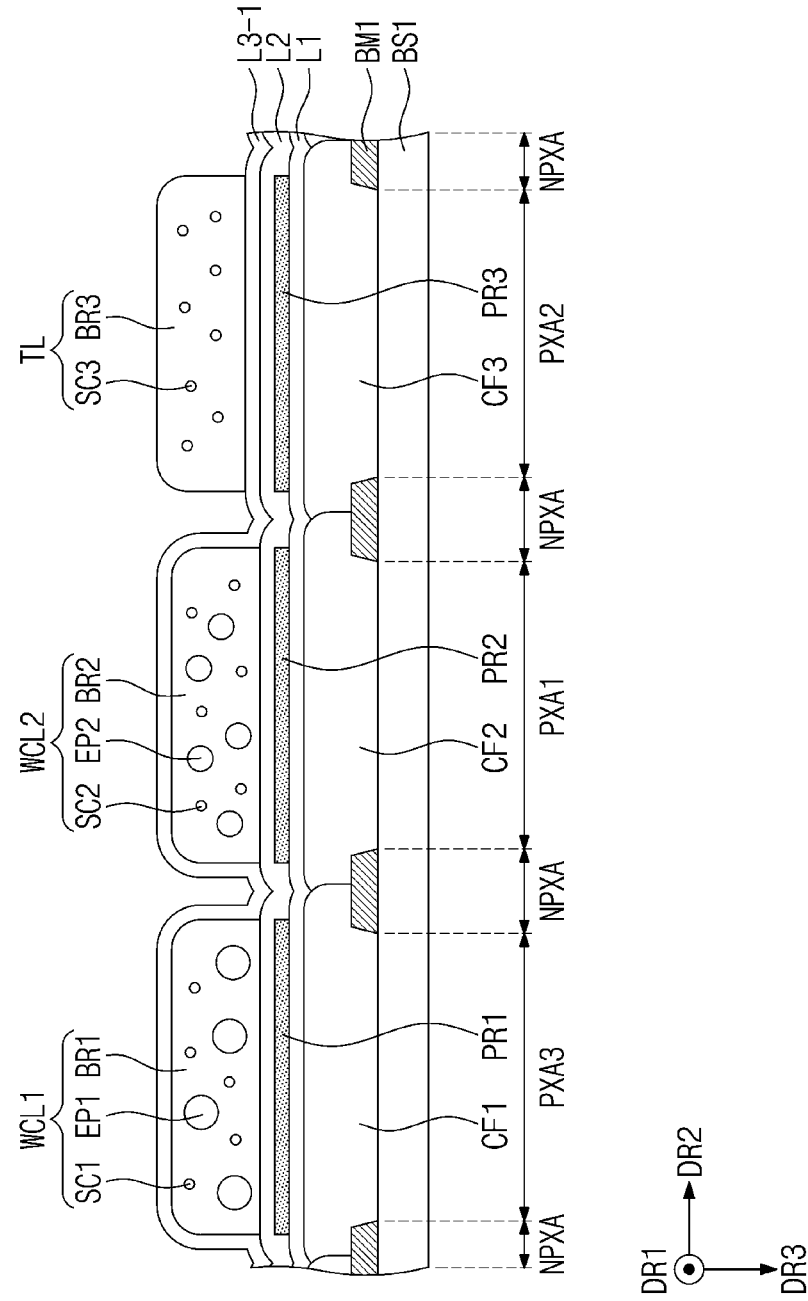

Referring to FIG. 6B, a first light control layer WCL1 may be formed on the first color filter layer CF1. A second light control layer WCL2 may be formed on the second color filter layer CF2. Thereafter, a third protective layer L3-1 overlapping the first light control layer WCL1 and the second light control layer WCL2 may be formed.

A third light control layer TL may be formed on the third color filter layer CF3. The third light control layer TL may be disposed on the third protective layer L3-1.

The light control layers WCL1, WCL2, and TL may be formed through a patterning process. A mask may be used in the patterning process. Light control layers WCL1, WCL2, and TL may be formed through subsequent exposure and development processes.

A portion of the second protective layer L2 in an area adjacent to the pixel areas PXA1, PXA2, and PXA3 may be removed. The photoresist layers PR1, PR2, and PR3 may be exposed by a portion of the removed second protective layer L2.

Referring to FIG. 6C, a photoresist removal solution may be provided to the exposed photoresist layers PR1, PR2, and PR3 (see FIG. 6B). The photoresist layers PR1, PR2, and PR3 (see FIG. 6B) may be removed through the photoresist removal solution to form a first opening HA1. Air may be filled in the first opening HA1.

Figure 6D:
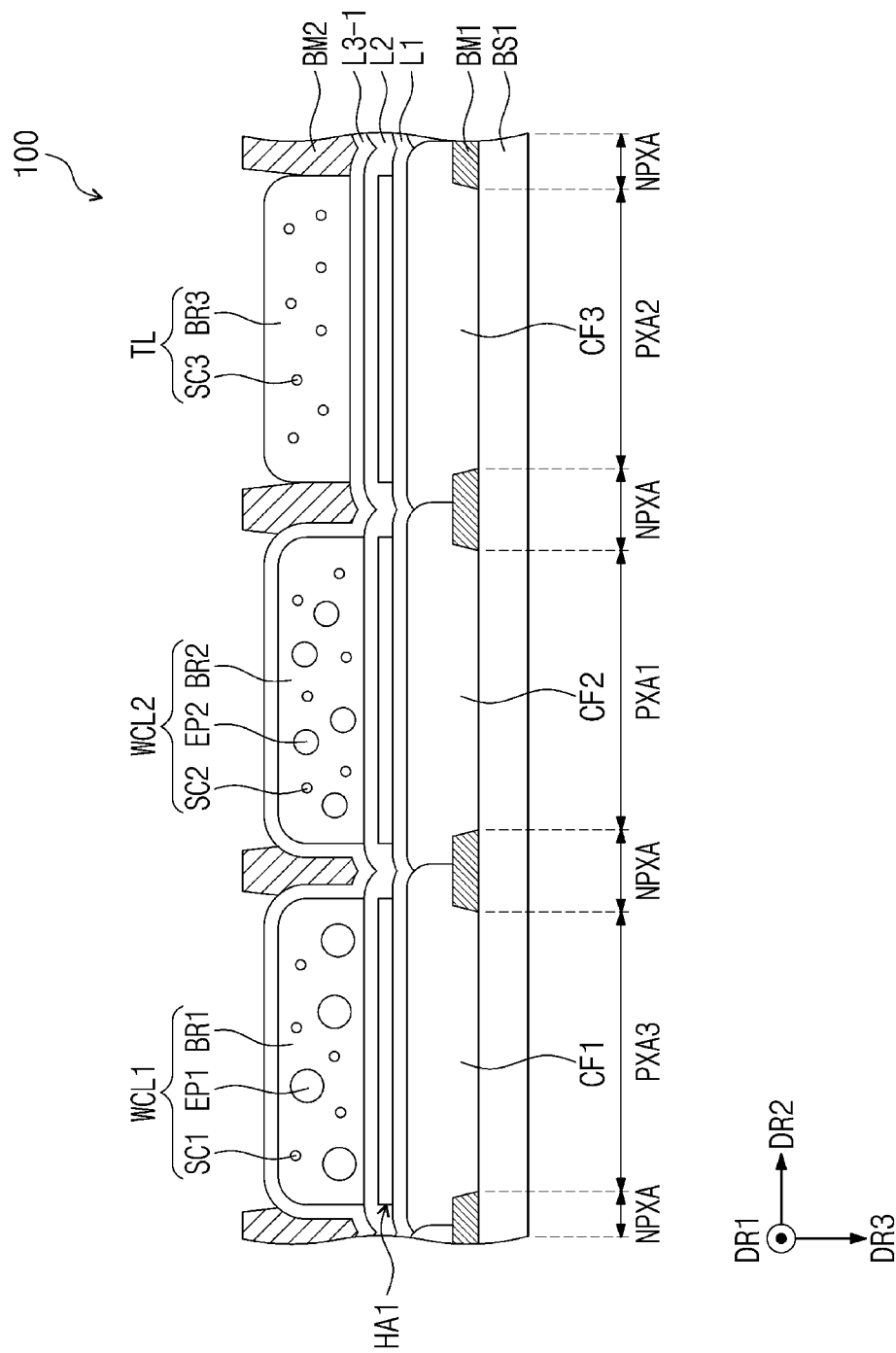

Referring to FIG. 6D, after the first opening HA1 is formed, liquid repellent treatment may be performed on the first opening HAL In case that barrier ribs BM2 are formed by the liquid repellent treatment, a material forming the barrier ribs BM2 may not be introduced into the first opening HA1.

A barrier ribs BM2 may be formed in a light blocking area NPXA. The barrier ribs BM2 may not overlap the pixel areas PXA1, PXA2, and PXA3. The barrier ribs BM2 may be formed to be spaced apart from each other with the light control layers WCL1, WCL2, and TL therebetween.

After the barrier ribs BM2 are formed, a first substrate 100 and a second substrate 200 (see FIG. 4) are bonded to each other to manufacture a display panel DP (see FIG. 4).

In an embodiment, light provided from an emission layer may be provided to an opening defined between a color filter layer and a light control layer. The refractive index of the light control layer may be higher than the refractive index inside the opening. A part of the light passing through the light control layer may be totally reflected on a lower surface of the opening. Light that is not converted by the light control layer in a part of the totally reflected light may be converted in the light control layer and may be provided back to the color filter layer. Accordingly, a display panel having improved light output efficiency may be provided.

Although the disclosure has been described with reference to some embodiments, it will be understood that the disclosure should not be limited to these embodiments but various changes and modifications can be made by those skilled in the art without departing from the spirit and scope of the disclosure.

Accordingly, the technical scope of the claimed invention is not intended to be limited to the contents set forth in the detailed description of the specification, but is intended to be defined by the appended claims.

What is claimed is:

1. A display panel comprising:
   a first substrate that includes a pixel area; and
   a second substrate disposed under the first substrate and including a light emitting element that emits first light to the first substrate,
   wherein the first substrate comprises:
   a base layer;
   a color filter layer disposed under the base layer and disposed in the pixel area;
   a light control layer disposed under the color filter layer, the light control layer converting received light into light of a predetermined color;
   a first opening disposed between the color filter layer and the light control layer, the first opening filled with a material having a lower refractive index than the light control layer;
   a first protective layer disposed between the color filter layer and the light control layer; and
   a second protective layer disposed on and directly above the light control layer and disposed between the first protective layer and the light control layer,
   wherein the first opening is directly on and over an upper surface of the second protective layer,
   the first opening partially penetrates into the second protective layer as seen in side view,
   the first opening is between a first portion of the first protective layer and a first portion of the second protective layer.

2. The display panel of claim 1, wherein the light control layer includes
   a resin;
   particles dispersed in the resin that convert the received light into the predetermined color; and
   scattering particles dispersed in the resin that scatter light.

3. The display panel of claim 1, wherein in a plan view, the color filter layer overlaps the light control layer and the first opening.

4. The display panel of claim 1, wherein air is disposed in the first opening.

5. The display panel of claim 1, wherein a refractive index inside the first opening is about 1 to about 1.1.

6. The display panel of claim 1, wherein a refractive index inside the first opening is lower than a refractive index of the color filter layer.

7. The display panel of claim 1, wherein
   the first portion of the first protective layer and the first portion of the second protective layer are spaced apart from each other, and
   a second portion of the first protective layer and a second portion of the second protective layer directly contact each other in a light blocking area adjacent to the pixel area.

8. The display panel of claim 1, wherein the first opening is thinner than the color filter layer as seen in side view.

9. The display panel of claim 1, wherein the first substrate comprises at least one second opening connected to the first opening in an area adjacent to the pixel area in the first substrate in a plan view.

10. The display panel of claim 9, wherein
    the first substrate comprises a third opening connected to the first opening in an area adjacent to the pixel area in the first substrate in the plan view,
    the third opening is spaced apart from the at least one second opening, and
    the first opening is between the third opening and the at least one second opening in the plan view.

11. The display panel of claim 10, wherein the at least one second opening and the third opening do not overlap the light control layer.

12. The display panel of claim 9, wherein
    the first substrate comprises a plurality of second openings,
    the plurality of second openings are spaced apart from each other, and
    the pixel area is disposed between the plurality of second openings.

13. The display panel of claim 1, wherein the light emitting element overlaps the first opening, the color filter layer, and the light control layer.

14. The display panel of claim 1, wherein
the first light passing through the light control layer is defined as second light, and
a part of the second light is totally reflected by a surface adjacent to the first opening.

15. The display panel of claim 1, wherein
the first opening is directly on and over the second protective layer, the first opening directly contacting the second protective layer, and
the first opening is thinner than the second protective layer as seen in side view.

* * * * *